(12) United States Patent
Cordingley et al.

(10) Patent No.: US 6,987,786 B2
(45) Date of Patent: Jan. 17, 2006

(54) CONTROLLING LASER POLARIZATION

(75) Inventors: James J. Cordingley, Littleton, MA (US); Donald V. Smart, Boston, MA (US); Michael Plotkin, Newton, MA (US); Joohan Lee, Andover, MA (US); William Lauer, Westford, MA (US); Jonathan S. Ehrmann, Sudbury, MA (US)

(73) Assignee: GSI Group Corporation, Billerica, MA (US)

( * ) Notice: Subject to any disclaimer, the term of this patent is extended or adjusted under 35 U.S.C. 154(b) by 0 days.

(21) Appl. No.: 10/013,956

(22) Filed: Dec. 13, 2001

(65) Prior Publication Data

US 2002/0141473 A1 Oct. 3, 2002

Related U.S. Application Data

(63) Continuation-in-part of application No. 09/770,275, filed on Jan. 29, 2001, now Pat. No. 6,381,259, which is a continuation of application No. 09/109,482, filed on Jul. 2, 1998, now Pat. No. 6,181,728, application No. 10/013,956.
(60) Provisional application No. 60/279,644, filed on Mar. 29, 2001.

(51) Int. Cl.
*H01S 3/10* (2006.01)
*H01S 3/08* (2006.01)
*B23K 26/00* (2006.01)
*B23K 26/38* (2006.01)

(52) U.S. Cl. .......................... 372/27; 372/26; 372/106; 372/107; 219/121.68; 219/121.69
(58) Field of Classification Search ............... 372/26, 372/27, 106, 107, 10, 18, 25; 219/121.68, 219/121.69
See application file for complete search history.

(56) References Cited

U.S. PATENT DOCUMENTS 4,462,150 A   7/1984   Nishimura et al.
4,494,220 A   1/1985   Dumbri et al.

(Continued)

FOREIGN PATENT DOCUMENTS

EP   0198716 A2   4/1986
EP   0-663-604 A1  7/1995

(Continued)

OTHER PUBLICATIONS

Bernstein, Joseph B.; Lee, Joo–Han; Yang, Gang; and Dahmas, Tariq A.; "Analysis of Laser Metal–Cut Energy Process Window"; IEEE Semiconductor Manufacturing; vol. 13, No. 2; pp. 228–234; May, 2000.

(Continued)

*Primary Examiner*—Minsun Oh Harvey
*Assistant Examiner*—Armando Rodriguez
(74) *Attorney, Agent, or Firm*—Gauthier & Connors, LLP

(57) ABSTRACT

A laser polarization control apparatus includes a polarization modifying device, such as a liquid crystal variable retarder, and a controller. The polarization modifying device receives a laser beam and modifies the polarization of the laser beam. The controller, which is connected to the polarization modifying device, adjusts an input to the polarization modifying device in order to control modification of the polarization of the laser beam based on alignment of a structure to be processed by the laser beam. For example, the polarization of the laser beam may be rotated to correspond with the alignment of a link in a semiconductor device to be cut by the laser beam. The polarization modifying device is configured for incorporation into a laser processing system that produces the laser beam received by the polarization modifying device and that focuses the laser beam modified by the polarization modifying device onto a workpiece that includes the structure to be processed by the laser beam. An analyzer tool receives the laser beam modified by the polarization modification device and measures the modification of the polarization of the laser beam by the polarization modification device.

55 Claims, 9 Drawing Sheets

U.S. PATENT DOCUMENTS

| | | | |
|---|---|---|---|
| 4,532,402 A | * | 7/1985 | Overbeck .................. 219/121 |
| 4,658,379 A | | 4/1987 | Fujishima et al. |
| 4,724,422 A | | 2/1988 | Golab |
| 4,795,720 A | | 1/1989 | Kawanabe et al. |
| 4,839,864 A | | 6/1989 | Fujishima |
| 4,847,810 A | | 7/1989 | Tagami |
| 4,908,493 A | | 3/1990 | Susemihl .............. 219/121.67 |
| 5,022,034 A | | 6/1991 | May et al. .................. 372/26 |
| 5,025,300 A | | 6/1991 | Billig et al. |
| 5,057,664 A | | 10/1991 | Johnson et al. ............. 219/121 |
| 5,172,391 A | | 12/1992 | Zayhowski ................ 372/106 |
| 5,185,753 A | | 2/1993 | Benda et al. ................ 372/27 |
| 5,204,836 A | | 4/1993 | Reed |
| 5,241,212 A | | 8/1993 | Motonami et al. |
| 5,255,217 A | | 10/1993 | Tan |
| 5,270,976 A | | 12/1993 | Tran |
| 5,300,756 A | | 4/1994 | Cordingley ........... 219/121.69 |
| 5,325,334 A | | 6/1994 | Roh et al. |
| 5,471,427 A | | 11/1995 | Murakami et al. |
| 5,808,768 A | | 9/1998 | Tadakuma et al. .......... 359/156 |
| 5,998,759 A | | 12/1999 | Smart .................. 219/121.69 |
| 6,057,180 A | * | 5/2000 | Sun et al. .................. 438/132 |
| 6,057,221 A | | 5/2000 | Bernstein et al. ............ 438/601 |
| 6,181,728 B1 | * | 1/2001 | Cordingley et al. ........ 372/106 |
| 6,281,471 B1 | | 8/2001 | Smart .................... 219/121.62 |
| 6,381,259 B2 | * | 4/2002 | Cordingley et al. ........ 372/106 |
| 2002/0015146 A1 | * | 2/2002 | Meeks et al. ................. 356/73 |

FOREIGN PATENT DOCUMENTS

| | | | |
|---|---|---|---|
| JP | 5-185254 | | 7/1993 |
| JP | 05-185254 | * | 7/1993 |
| JP | 7-218889 | | 8/1995 |
| WO | WO 00/02292 | | 1/2000 |

OTHER PUBLICATIONS

Bernstein, Joseph B.; Hua, Yijia; and Zhang, Wei; "Laser Energy Limitations for Buried Metal Cuts"; IEEE Electron Device Letters; vol. 19, No. 1; pp. 4–6, 1998.

Smith, Robert T. and Chlipala, J. D.; "Laser Programmable Redundancy and Yield Improvement in a 64K DRAM"; IEEE Journal of Solid–State Circuits; vol. SC–16, No. 5; pp. 506–514; Oct. 1981.

* cited by examiner

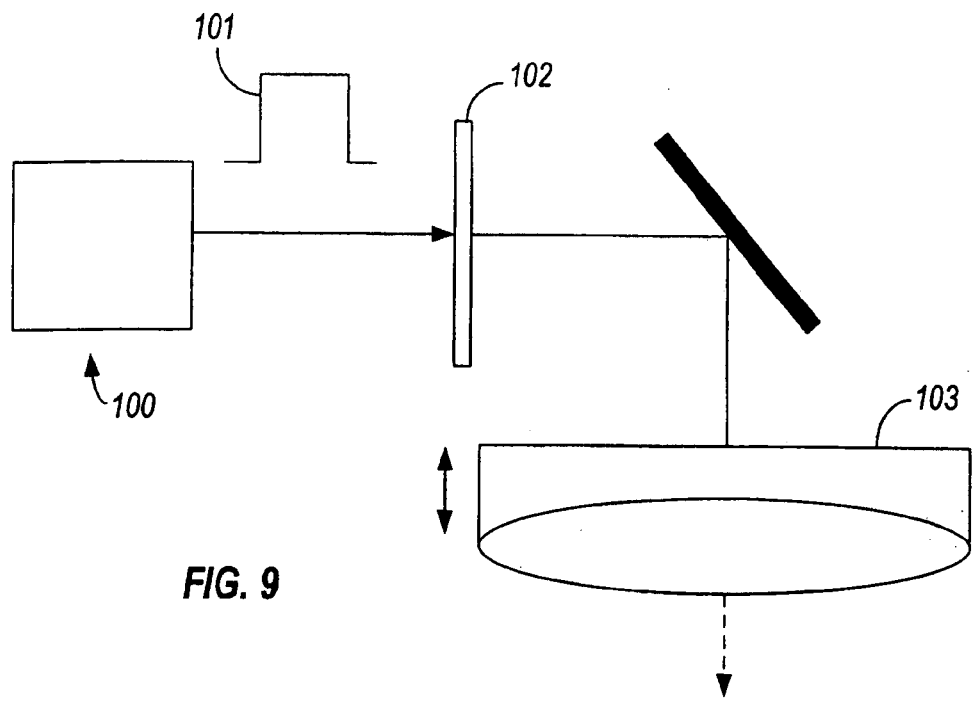
FIG. 9
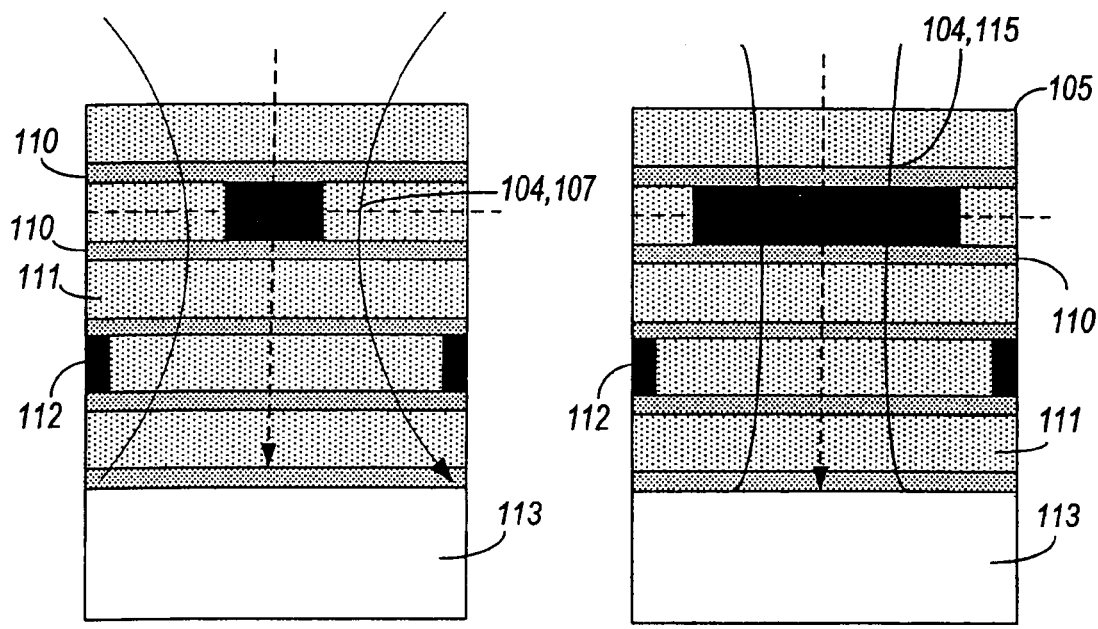
FIG. 9A          FIG. 9B

CONTROLLING LASER POLARIZATION

CROSS REFERENCE TO RELATED PATENTS AND APPLICATIONS

This application is a continuation in part of U.S. patent application Ser. No. 09/770,275, filed Jan. 29, 2001, now U.S. Pat. No. 6,381,259, which is a continuation of U.S. patent application Ser. No. 09/109,482, filed Jul. 2, 1998, now U.S. Pat. No. 6,181,728, the entire disclosure of which is hereby incorporated herein by reference. This application also claims the benefit of U.S. Provisional Application 60/279,644, entitled "Method and System for Severing Highly Conductive Micro-Structures," filed Mar. 29, 2001, the entire disclosure of which is hereby incorporated herein by reference. This application is also related to U.S. Ser. No. 09/473,926 filed Dec. 28, 1999, now U.S. Pat. No. 6,281,471, the entire disclosure of which is hereby incorporated herein by reference. The aforementioned patents and applications are assigned to the assignee of the present invention.

TECHNICAL FIELD

The present invention relates in general to laser processing of workpieces such as semiconductor devices and more particularly concerns processing of DRAMS, memories, and programmable devices by cutting fuses or links.

BACKGROUND

The present invention relates in general to laser processing of workpieces such as semiconductor devices and more particularly concerns processing of DRAMS, memories, and programmable devices by cutting fuses or links.

Laser systems have been used for many years in the fabrication of DRAMS and programmable devices. In DRAM production, for example, redundant memory is programmed by using a focused laser beam to cut fuses or links in the memory in order to replace defective memory cells. The programming is accomplished by disconnecting the fuses or links using a laser pulse generated by a diode pumped Q-switched YAG (or YLF) laser.

Semiconductor devices have link geometries typically about 1 microns wide by 5 microns long, but the trend is toward finer geometry to support increasingly high density DRAM devices, for example a link dimension of 0.6 microns×5 microns. These links may be located in groups of horizontally aligned links and vertically aligned links. A laser having 3–5 micron laser spot size has often been used to disconnect such a link using a single laser pulse. By appropriately selecting the laser energy, the spot size, the laser pulse width, and the wavelength of the laser beam, it is possible to optimize laser parameters in order to achieve the cleanest and most reliable link disconnect.

The quality of a link disconnect may be evaluated by visually inspecting the blasted link. One measure of practicality in fuse or link disconnect is the energy cutting range or "energy window," which is the range of energies per pulse over which clean and reliable link cutting can be achieved. The laser energy that is used to process a semiconductor device can be set at the center of the predicted energy window, which may differ somewhat from the actual energy window due to process variations such as the thickness of the link material, the thickness of oxide material located on top of the link, laser instability, errors in the positioning of the laser beam, and focusing errors.

Polysilicon has been widely used for the link material for the past years due to its superior cut quality. Material properties, such as the deep absorption in the 1 $\mu$m wavelength range, provides relatively uniform temperature distribution. This relatively uniform temperature distribution promotes clean removal of link material by laser irradiation. However, the high resistance and complex processing of polysilicon limits its use in deep sub-micron application (See J. B. Bernstein, Y. Hua, W. Zhang, "Laser Energy Limitations for Buried Metal Cuts", *IEEE Electron Device Letters*, Vol. 19, No. 1, pp. 4–6, 1998).

Aluminum fuses became a new candidate to replace polysilicon and have been studied recently for their manufacturability and reliability. Various failure mechanisms, including lower corner cracking and material remaining at the bottom of the cut site, have been investigated and set the high and low bounds, respectively, of the laser energy window (see J. B. Bernstein, J. Lee, G. Yang, T. Dahmas, "Analysis of Laser Metal-Cut Energy Process Window," *IEEE Semiconductor Manufacturing*, Vol. 13, No. 2, pp. 228–234, 2000). Furthermore, collateral damage to the adjacent fuse structures or substrate due to excessive energy and laser spot positioning error is also another failure mode at high laser energy.

More recently, for high-performance logic devices and high-speed SRAM, copper has been investigated as link material due to its enormous benefits when compared to aluminum, such as its low resistance, power dissipation, manufacturing cost, and superior resistance to electromigration. However, there have been found some difficulties in the laser processing of copper fuses because of the different material properties and fabrication of copper metallization, such as lower coefficient of thermal expansion and higher melting point, as well as its thick structure.

Many diode-pumped solid-state lasers used in laser processing systems are linearly polarized. Certain laser processing systems use circularly polarized laser beams rather than linear polarized laser beams.

SUMMARY

One aspect of the invention features a laser polarization control apparatus that includes a polarization modifying device, such as a liquid crystal variable retarder, and a controller. The polarization modifying device receives a laser beam and modifies the polarization of the laser beam. The controller, which is connected to the polarization modifying device, adjusts an input to the polarization modifying device in order to control modification of the polarization of the laser beam based on alignment of a structure to be processed by the laser beam. For example, the polarization of the laser beam may be rotated to correspond with the alignment of a link in a semiconductor device to be cut by the laser beam. The polarization modifying device is configured for incorporation into a laser processing system that produces the laser beam received by the polarization modifying device and that focuses the laser beam modified by the polarization modifying device onto a workpiece that includes the structure to be processed by the laser beam.

Thus, according to the invention, a linearly or elliptically polarized laser beam may be aligned with a link to be cut. For example, the polarization of the laser beam may be vertically aligned when the link is aligned vertically and may be horizontally aligned when the link is aligned horizontally. It has been discovered that by utilizing this technique it is possible to increase the range of acceptable cutting energies that are effective for cutting certain types of links. This range of acceptable cutting energies is the energy window. Thus, by switching the polarization of the laser beam depending on the link orientation, the best results are obtained in terms of maximizing the width of the energy window. There may also be certain types of links for which the energy window is maximized when a linearly polarized laser beam is aligned perpendicularly to the link, or at some other angle, rather than parallel to the link.

Another aspect of the invention features an analyzer tool that receives the laser beam modified by the polarization modification device. The analyzer tool measures the modification of the polarization of the laser beam by the polarization modification device. A plurality of inputs are applied to the polarization modifying device to control modification of the polarization of the laser beam, and the laser beam modified by the polarization modification device is analyzed using the analyzer tool in order to measure modification of the polarization of the laser beam by the polarization modification device. The relationship between the inputs to the polarization control device and the modification of the polarization of the laser beam is stored. When the laser system is used to process a structure, the polarization modification device may modify polarization of the laser beam based on this stored relationship.

By applying a variety of inputs to the polarization modification device and by analyzing the laser beam modified by the polarization modification device, it is possible to identify the appropriate inputs required to obtain vertical linear polarization and horizontal linear polarization, for example. These inputs can then be stored for later use when the laser system processes links on a semiconductor device, so that the appropriate inputs can be applied to the polarization modification device to ensure that the polarization of the laser beam will be vertically aligned when the link is aligned vertically and horizontally aligned when the link is aligned horizontally.

Another aspect of the invention features an apparatus and method for improving an energy window (relative process window), by exploiting polarization modes in conjunction with other laser spatial and temporal pulse characteristics. In certain embodiments of this aspect of the invention the energy window is controlled by selection of a spot distribution and selection of a polarization mode. In certain embodiments, the energy window is improved with respect to a memory or other logic device repair process in which the target structure is a copper fuse.

Numerous other features, objects, and advantages of the invention will become apparent from the following detailed description when read in connection with the accompanying drawings.

DESCRIPTION OF DRAWINGS

FIG. 9 is a schematic drawing of certain elements of a laser system used for practicing the present invention, the illustrated elements affecting the energy window.

FIG. 9-A is a cut-away cross-sectional drawing of a link structure of an exemplary multi-level memory device, showing the narrow dimension (width) of a link having a rectangular structure, and a focused laser beam incident on the device.

FIG. 9-B is a cut-away cross-sectional drawing, taken along a plane orthogonal to that of FIG. 9-A, showing the long dimension (length) of a link and an exemplary focused laser beam, the beam aspect ratio roughly corresponding to the link aspect ratio.

Like reference symbols in the various drawings indicate like elements.

DETAILED DESCRIPTION

Figure 1:
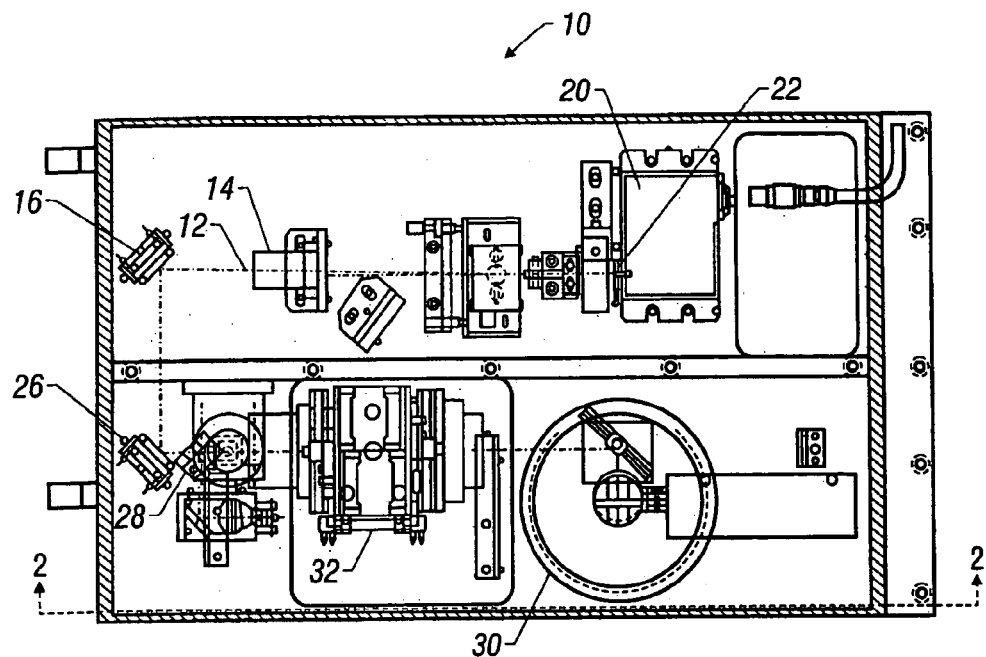
FIG. 1 is a horizontal cross-sectional view of a laser system according to the invention prior to installation of a liquid crystal variable retarder and a polarizing beamsplitter.

According to the polarization control concept described below, a linearly or elliptically polarized laser beam is aligned with a link to be cut in order to increase the energy window of a laser processing system. Because the invention provides a broad range of energies over which a given link can be cut well, the invention increases the likelihood of successful disconnection of the link despite known or unknown process parameters that tend to affect the processing of the link and therefore affect the optimal cutting energy. These process parameters can include, for example, the uncertainty in the thickness of an oxide layer over the link material, slight misalignments of the link with the laser beam due to positioning errors, instability of the laser pulse or of the laser pulse energy, focus errors, and uncertainty as to the thickness of the link.

For example, if there is a very thin oxide layer over a particular link it takes a very small amount of energy to cut that oxide layer. If, on the hand there is a very thick oxide layer over the link, then a large amount of energy will be required in order to cut the oxide layer.

For a particular type of link on a particular semiconductor device, the laser energy that is to be used to cut the link is set based on an experimental determination of the center of the predicted energy window for the particular type of link. For example, certain semiconductor wafers may have a thick oxide layer while others may have a thin oxide layer or no oxide layer. The customer may perform an experimental energy study on different types of wafers in order to determine the predicted energy window for a thin wafer and the predicted energy window for a thicker wafer, which will typically cover a higher energy range. Also, in a given semiconductor wafer containing semiconductor devices to be processed there could be various different types of links that require different energies to be optically cut. At the edges of the wafer, for example, there may be processing considerations from which it is experimentally determined that the center of the predicted energy window should be different as compared with other regions of the wafer.

It is not possible, however, to know with certainty the actual energy window for each given individual link (as opposed to the predicted energy window that includes the preselected laser energy) because of possible positioning errors, focus problems, uncertainty as to link thickness, uncertainty as to oxide thickness, instability of the laser, etc. Nevertheless, because the invention provides a wide range of energies that are effective for cutting a given link, the preselected laser energy is likely to fall within this wide range for the given link, because the actual energy window is very likely to overlap the preselected laser energy. For this reason, the large energy cutting range provided by the invention is very useful for maintaining reliable link cutting.

Because the invention utilizes a linearly or elliptically polarized laser beam rather than a circularly polarized laser beam, it is possible to align the polarization of the laser beam with the link and thereby optimize the actual energy window. On the other hand, if the laser beam used to cut a particular link is circularly polarized, the actual energy window may, at least under certain circumstances, be larger than it would be if the same laser beam were linearly or elliptically polarized and aligned perpendicularly to the link. Thus, certain laser systems according to the invention can allow the user to select a circularly polarized laser beam as a compromise option if the user does not wish to go through the process of ensuring that a linearly or elliptically polarized laser beam is aligned with the link. It is believed that the largest energy windows can be achieved by aligning a linearly polarized beam with the link to be cut.

Figure 2:
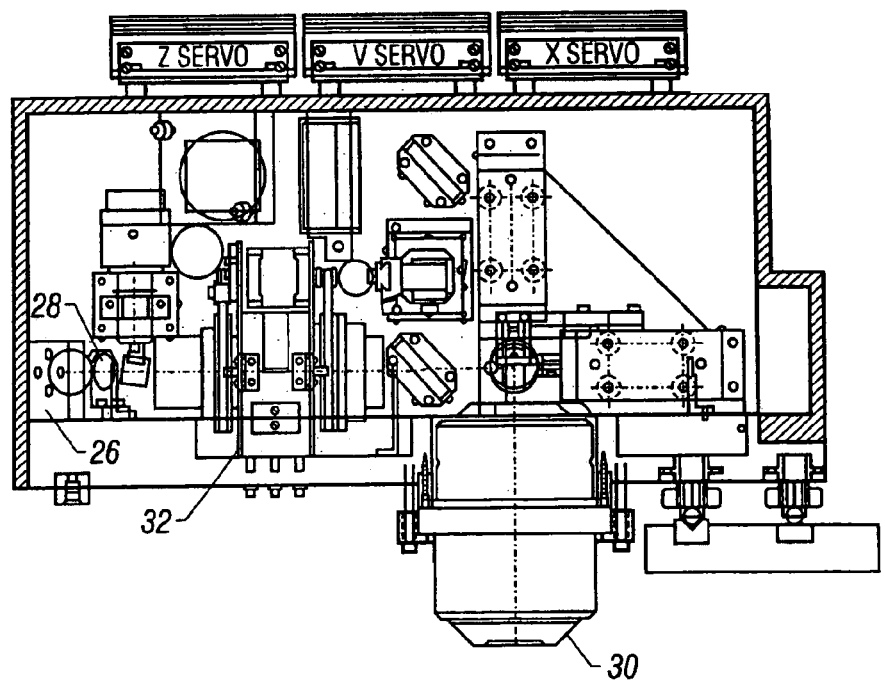
FIG. 2 is a vertical cross-sectional view of the laser system of FIG. 1 taken along line 2—2 in FIG. 1.
Figure 4:
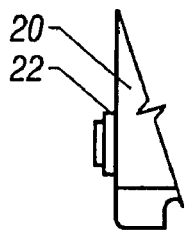
FIG. 4 is a detailed drawing of the laser head and the rotatable halfwave plate of the laser system of FIG. 1.

FIGS. 1 and 2 show the major components of a laser system 10 according to the invention, prior to installation of a liquid crystal variable retarder and a polarizing beamsplitter that are used to adjust linear polarization based on the alignment of a link to be cut. Diode-pumped Q-switched laser head 20 produces a laser beam 12, shown by a dashed line, that passes through halfwave plate 22 (see the detail shown in FIG. 4) that causes the laser beam to be linearly polarized. Laser beam 12 proceeds through small pre-expander telescope assembly 14, which may, for example, expand the laser beam about three times, and then laser beam 12 reflects off of rear turning mirror 16, taking a 90-degree turn. Laser beam 12 reflects off of front turning mirror 26 and proceeds through beamsplitter 28 and telescope assembly 32 toward scan lens 30, which includes galvanometers 34 and 36 that direct laser beam 12 toward a work surface.

Figure 3:
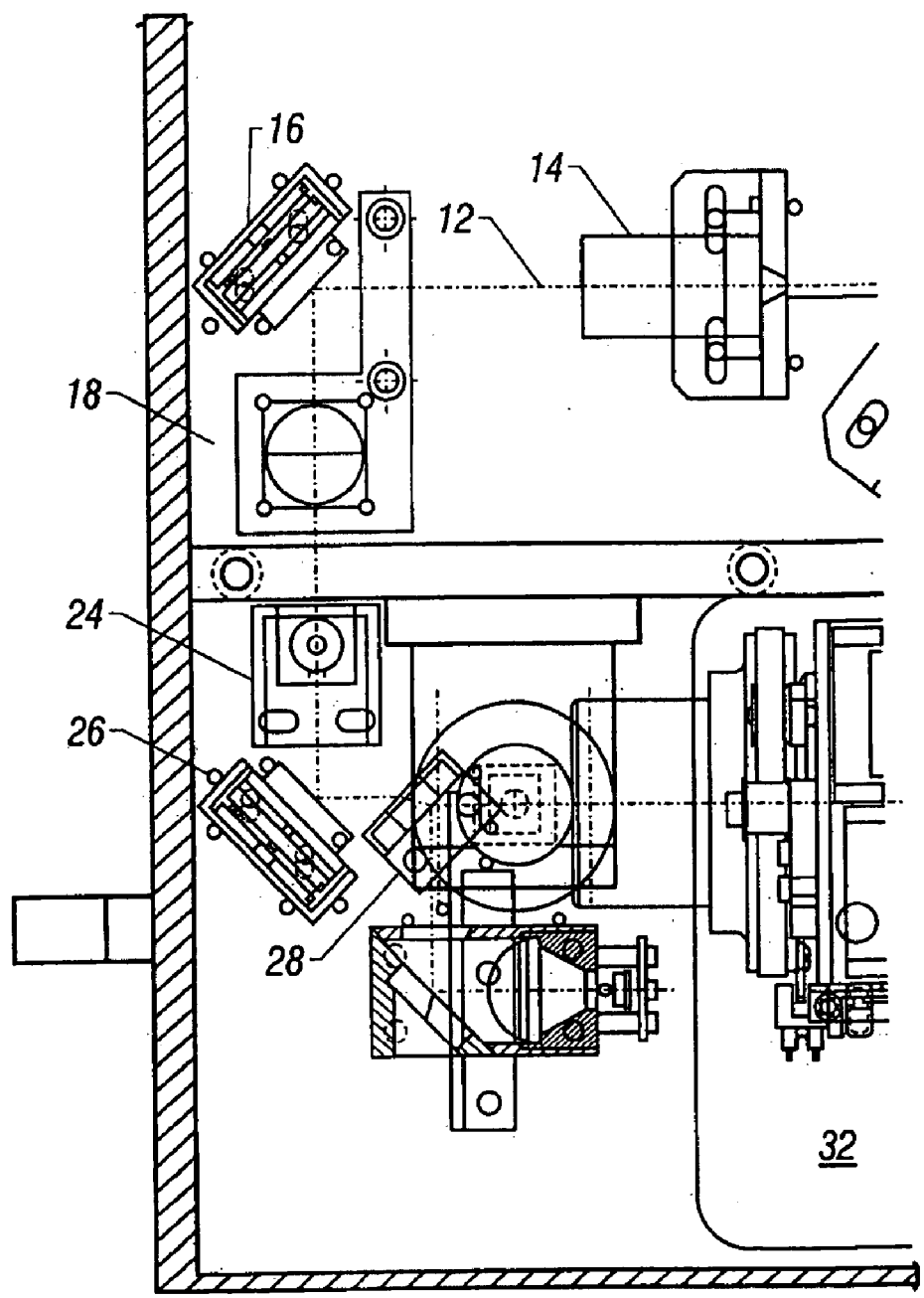
FIG. 3 is a horizontal cross-sectional view of a portion of the laser system of FIG. 1 after installation of the liquid crystal variable retarder and the polarizing beamsplitter.

Referring to FIG. 3, which shows the laser system 10 of FIGS. 1 and 2 after installation of a liquid crystal variable retarder 24 and a polarizing beamsplitter 18, after laser beam 12 reflects off of rear turning mirror 16, it proceeds through polarizing beamsplitter assembly 18, which dumps a portion of the energy of the laser beam (in order to obtain stable, short pulses, the laser may be operated at maximum power, with the laser rod being pumped as hard as possible). Polarizing beamsplitter assembly 18 dumps the horizontally polarized portion of laser beam 12 and allows vertically polarized portions of laser beam 12 to be transmitted through it. Laser beam 12 itself is linearly polarized prior to entering polarizing beamsplitter assembly 18, and so by rotating half wave plate 22 it is possible to control the percentage of laser beam 12 that is dumped by polarizing beamsplitter assembly 18, so that polarizing beamsplitter assembly 18 in effect functions as a variable beamsplitter. Laser beam 12 coming out of polarizing beamsplitter assembly 18 is always vertically polarized.

A voltage-controlled liquid crystal variable retarder (LCVR) and mount 24, provided according to the invention, includes a birefringent liquid crystal sandwiched between two plates. As is known in the art, the birefringent liquid crystal can rotate the polarization of a laser beam, because light moves at different speeds along different axes through the birefringent liquid crystal, resulting in a phase shift of the polarization. Moreover, the birefringent liquid crystal can also transform the linearly polarized laser input into an elliptically or circularly polarized laser output. Laser beam 12 maintains its polarization as it travels from LCVR 24 to the work surface. No other optics external to laser system 10 are required in order to change the polarization of laser beam 12. In alternative embodiments the polarization modifying device may be a motorized device.

Figure 5:
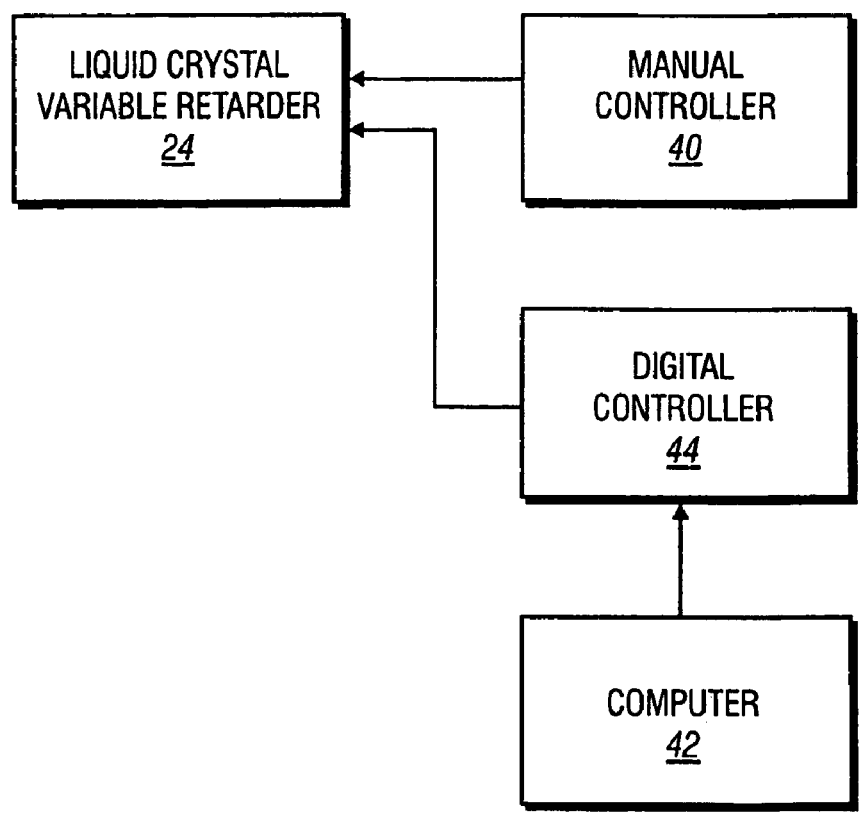
FIG. 5 is a block diagram of the components of a system that controls the voltage applied to the liquid crystal variable retarder of the laser system of FIG. 1.

With reference to FIG. 5, the voltage applied to liquid crystal variable retarder 24 is controlled by a digital controller 44 and/or a manual controller 40, which interface with liquid crystal variable retarder 24 through a cable that passes through a cable port of the laser system shown in FIG. 1. Manual controller 40 can be adjusted by a user in order to vary the voltage to LCVR 24, based on the user's knowledge of whether a link to be destroyed is vertical or horizontal, for example. Digital controller 44 receives input from computer 42 in order to automatically vary the voltage to LCVR 24 based on information stored in computer 42 pertaining to the alignment of the links to be cut. This input from computer 42 controls digital controller 44 so as to cause an appropriate voltage to be applied to LCVR 24. The correct voltages to achieve horizontal polarization, vertical polarization, circular polarization, etc. can be determined experimentally. In one embodiment, digital controller 44 is programmed to select among three different voltages corresponding to vertical linear polarization, horizontal linear polarization, and circular polarization. In other embodiments digital controller 44 stores sixty-four or ninety-six different voltages, including voltages corresponding to various elliptical polarizations. Other embodiments are also possible in which the liquid crystal variable retarder is capable of rotating linear polarization to numerous angles other than the vertical or the horizontal, in the event that polarization at such angles proves useful for cutting certain types of structures.

Figure 6:
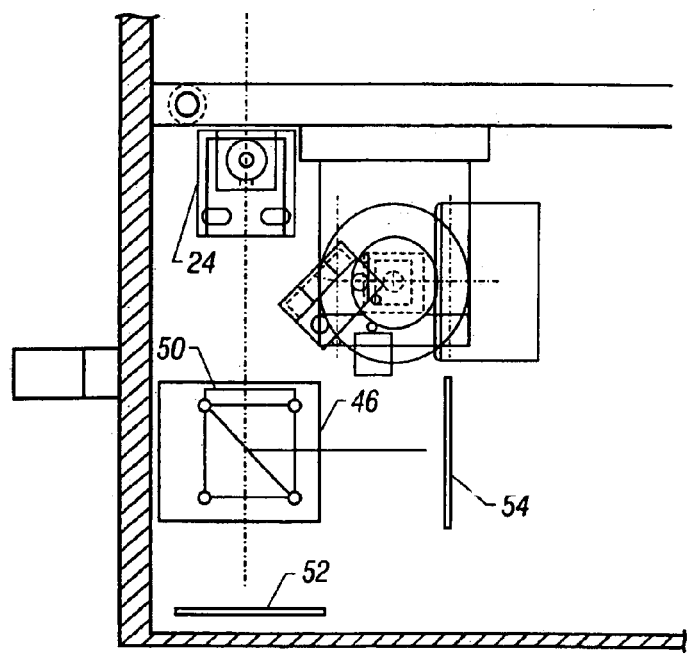
FIG. 6 is a horizontal cross-sectional view of a portion of the laser system of FIG. 1 after installation of a liquid crystal variable retarder and a polarizing beamsplitter analyzer tool to determine experimentally the appropriate voltages to apply to the liquid crystal variable retarder to provide a circularly polarized laser beam output.

With reference to FIG. 6, in order to determine experimentally the appropriate voltages to apply to LCVR 24 to provide a circularly polarized laser beam output, the front turning mirror 26 (FIG. 3) is removed from the laser system, so that laser beam 12 continues toward a polarizing beamsplitter analyzer tool 46 that is inserted into the laser system. Polarizing beamsplitter analyzer tool 46, which is used to analyze the polarization of laser beam 12 after it passes through LCVR 24, includes polarizing beamsplitter 48 having a quarter wave plate 50 positioned in front of it. Quarter wave plate 50 linearizes any circularly polarized light received from LCVR 24, so that when this circularly polarized light goes to the polarizing beamsplitter it will be 100 percent transmitted or 100 percent reflected depending on its handedness. Detection plates 52 and 54 detect the amount of light that is transmitted through polarizing beamsplitter 48 and the amount of light reflected by polarizing beamsplitter 48, respectively. If the light received from LCVR 24 is not circularly polarized, however, but is instead elliptically polarized, then less than 100 percent of the light received from LCVR 24 will be transmitted or reflected. In this manner it is possible to determine whether a voltage that is applied to LCVR 24 is appropriate for yielding circular polarization.

Figure 7:
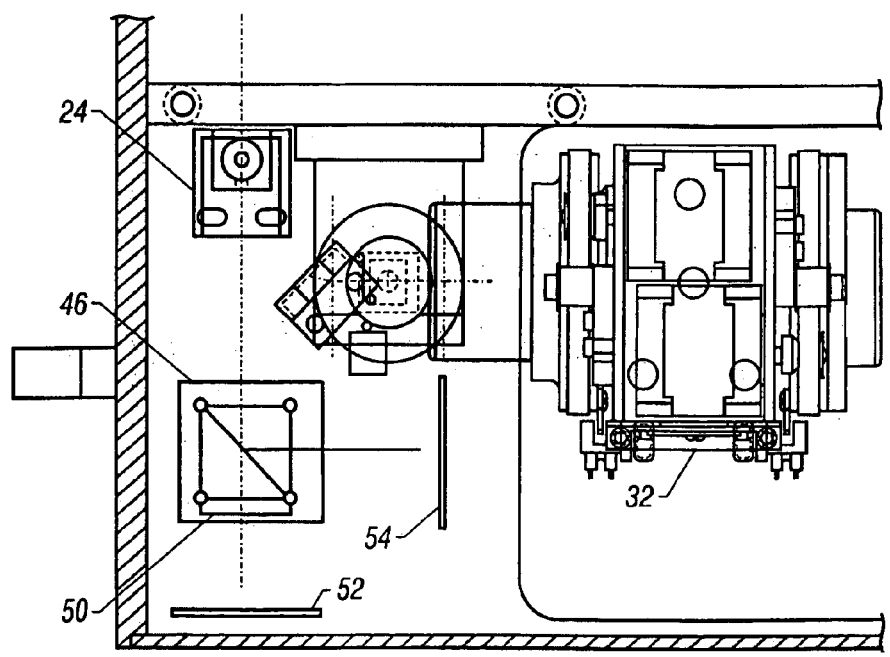
FIG. 7 is a horizontal cross-sectional view of a portion of the laser system of FIG. 1 after installation of a liquid crystal variable retarder and a polarizing beamsplitter analyzer tool to determine experimentally the appropriate voltages to apply to the liquid crystal variable retarder to provide a vertically or horizontally polarized laser beam output.

With reference to FIG. 7, in order to determine experimentally the appropriate voltages to apply to LCVR 24 to provide a vertically or horizontally polarized laser beam output, the orientation of beamsplitter analyzer tool 46 is flipped so that polarizing beamsplitter 48 is positioned in front of, rather than behind, quarter wave plate 50. In this orientation, quarter wave plate 50 does not perform any useful function because it simply converts linearly polarized light into circularly polarized light without changing the energy of the light that passes through it. If laser beam 12 is linearly polarized it should either be 100 percent transmitted through polarizing beamsplitter 48 or 100 percent reflected by polarizing beamsplitter 48, depending on whether laser beam 12 is vertically or horizontally polarized.

The procedures described above in connection with FIGS. 6 and 7 may be performed at the point of manufacture of the apparatus of FIG. 3, or at the point of installation of LCVR and mount 24 into an existing laser system in the case of an upgrade. After these procedures are performed, beamsplitter analyzer tool 46 should be removed from the laser system and the front turning minor should be re-installed into the laser system. By applying a variety of voltages to LCVR 24 and observing the relative amounts of light detected by detection plates 52 and 54, it is possible to identify the appropriate voltage required to obtain vertical linear polarization, horizontal linear polarization, and circular polarization. These voltages can then be stored by computer 42 or digital controller 44 or can be recorded for use by a user of manual controller 40. A customer may program digital controller 44 to cause any arbitrary voltage to be applied to LCVR 24. For example, if a particular customer desires to identify a voltage that yields vertical elliptical polarization or horizontal elliptical polarization, the customer can find this voltage experimentally using the techniques described above in connection with FIGS. 6 and 7. The techniques described in connection with FIGS. 6 and 7 should be performed on an apparatus-by-apparatus basis because there may be some variation in the operation of LCVR 24 on an apparatus-by-apparatus basis and because different lasers may operate at different wavelengths, different voltages, and different polarizations. Thus, for example, if it were desired change the wavelength at which a particular laser system operates, it would be important to perform the experimentation procedures described above again.

Of particular interest is the improvement of an energy window for memory repair applications, particularly when applied to high-density devices. For example, increasing use of copper as metallization is occurring in the semiconductor industry due to its superior material properties with respect to other metals. The damascene process enabled copper to be a main on-chip conductor for all types of integrated circuits. This fabrication method of copper metallization is different from the typical fabrication to form aluminum metal lines, and so it is considered that the mechanical phenomena under laser heat is not exactly the same as the case of aluminum. Furthermore, the surrounding structures of the circuit include functional circuitry, and thus undesirable damage that would adversely affect operation should be avoided during laser processing of the link structures. A typical link might have a rectangular cross section (viewed from the top) with about an 8:1 aspect ratio, with the narrow dimension a fraction of one micron (e.g., 0.6×5 microns), a dimension on the order of a visible wavelength of light. In an exemplary embodiment of the present invention the laser spot distribution and temporal pulse shape are also selected to allow for efficient coupling of energy to the link while avoiding substrate damage and collateral damage to other adjacent structures. The spot shape and position influence the coupling of energy to a link.

FIG. 9 is a schematic representation showing certain elements affecting the energy window, and used in a system for practicing an embodiment of the present invention. A pulsed laser 100 produces a fast-rising pulse 101, though other pulse shapes may be used, including a standard q-switched pulse, an amplified mode locked pulse train, or other pulses suitable for a material processing operation. The polarization controller 102 described above produces an output that is focused by the high numerical aperture lens system 103 into an approximately diffraction-limited spot 104 on the target link structure 105. For instance, a measure of the spot quality might indicate an M-squared factor of approximately 1.1, indicating a 10% deviation from ideal performance. An expanded view of FIG. 9-A (showing link width) of the region near the beam waist having width Wy0 107 is shown, where the spot position (in three dimensions) is set to maximize energy concentration on the link. In one embodiment of the invention the target structure 105 may comprise numerous dielectric layers 110, 111 disposed near internal functional circuitry 112, with the link structure set apart from the silicon substrate 113 by several microns. In a link-blowing system according to the invention damage is avoided to the internal layers, functional circuitry, and substrate.

The irradiance distribution at the target location 105 may substantially conform to a diffraction limited, circular Gaussian profile. In another advantageous embodiment the beam has an approximate elliptical Gaussian irradiance profile, as might be produced with an anamorphic optical system, or with a non-circular laser output beam. In one embodiment the incident beam has a non-uniform aspect ratio of, e.g., 3:1 (107,115), as illustrated in the view of FIG. 9-B, which is orthogonal to that of FIG. 9-A. Alternatively, rectangular or other chosen spatial profiles may be implemented in a lateral dimension. U.S. Pat. No. 5,300,756, assigned to the assignee of the present invention, the entire disclosure of which is hereby incorporated herein by reference, discloses certain advantageous methods and optical systems for spatially shaping laser beams for application to memory repair.

Figure 11:
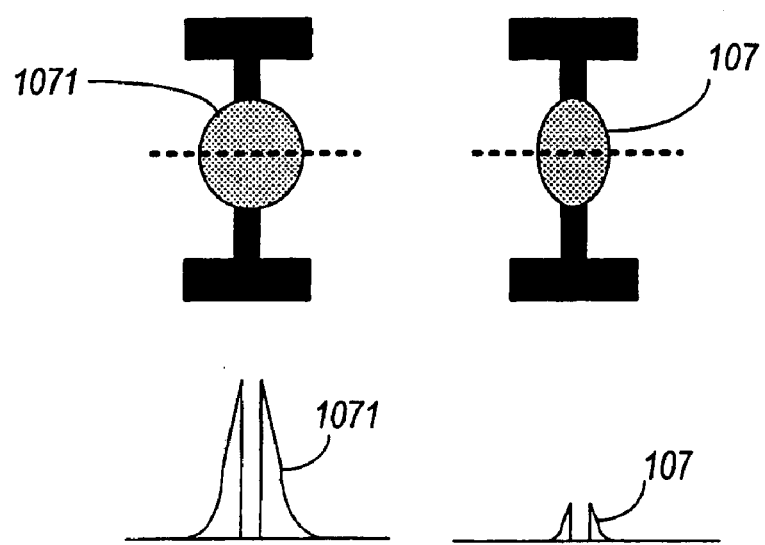
FIG. 11 is a pair of drawings of a link, showing exemplary circular and elliptical spots used for link processing and the corresponding intensity distribution (off-link energy)
Figure 10A:
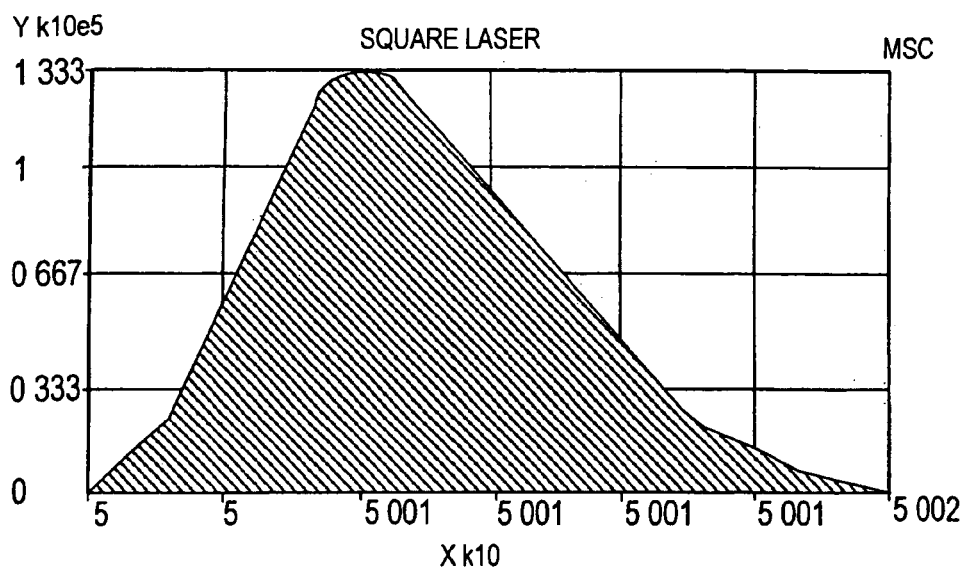
FIG. 10A is a diagram of a typical Gaussian-like pulse, obtained from a q-switched laser system
Figure 10B:
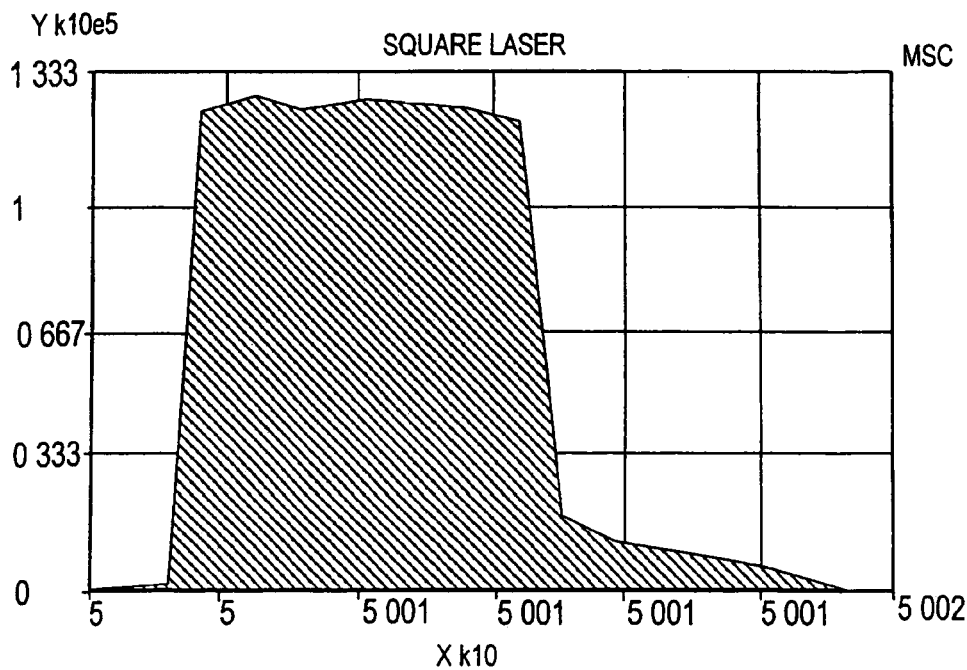
FIG. 10B is a diagram of a fast rise/fall-time laser pulse, in accordance with the invention.

FIG. 11 depicts and exemplary spot intensity distribution corresponding to an elliptical Gaussian at the target location, the spot intensity distribution having width Wy0. It is to be understood that other spot distributions may be used when practicing the invention, including a symmetric circular Gaussian, or an elliptical Gaussian along the link width and uniform ("top-hat") along the length. With the nearly diffraction limited elliptical Gaussian case, the minimum beam waist dimension at the target location approximates the narrow target width dimension, which in turn produces high pulse energy density at the link. In a system according to the invention the energy enclosed by the link is increased (107) as opposed to the prior art method of overfilling the link structure (1071) and relying upon low substrate absorption to prevent damage. A typical copper link used in a present memory has width and thickness of about 1 micron or less, for example 0.6 micron, and length of a few microns. Future memory requirements are expected to further reduce the scale of target dimensions. With reference to FIG. 9A, 9B, and 11, the minimum beam waist dimension Wyo (107) will typically overfill the sub-micron link to some degree, whereas aspect ratio Wxo/Wyo (115,107) with Wxo a few microns along the link, can facilitate clean link removal.

Figure 12:
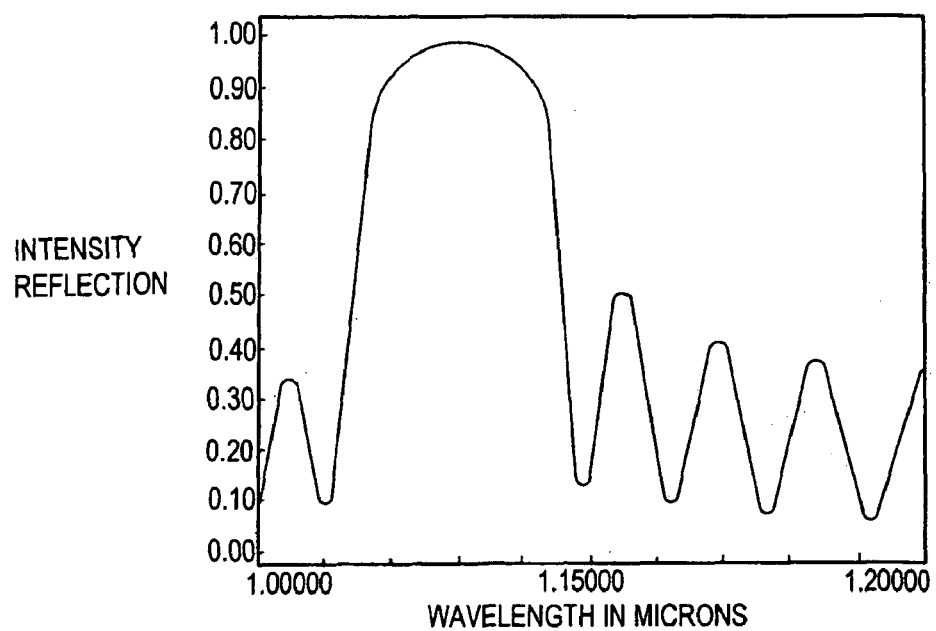
FIG. 12 is a diagram illustrating reflection at normal incidence as a function of wavelength by a multilevel memory device having numerous layers of silicon nitride and silicon dioxide.

Polarization modes may couple into the target and background structures in a complex manner. For example, FIG. 12 shows the transmission through the layers of a multilevel device comprising a copper link structure and 28 layers (14 pairs) of dielectric (silicon dioxide, silicon nitride). The reflected intensity varies substantially with wavelength at normal incidence. Furthermore, variations occur in the S and P components (the orthogonal and parallel components of polarization), and with average polarization. Further, it is known in the art that reflectance for S, P, and average polarization also varies with incident angle. In accordance with the present invention the polarization can be selected on the basis of the target coupling characteristics, the film reflectance, or a combination thereof.

Figure 8:
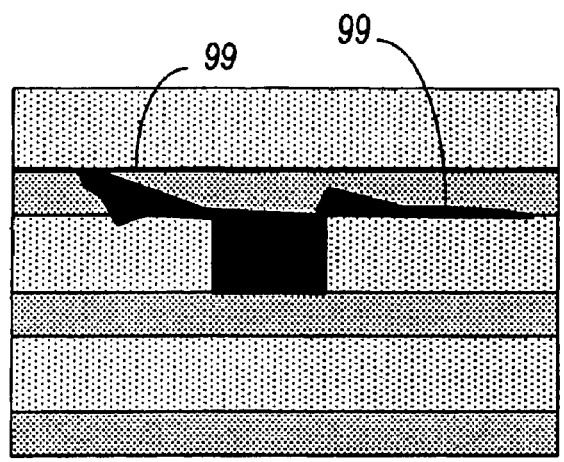
FIG. 8 is a schematic, cross sectional drawing of a copper link site processed with low laser energy, illustrating the initiation of upper corner cracking.

U.S. Pat. No. 6,281,471, assigned to the assignee of the present invention, teaches the use of fast rising pulses 101 (FIG. 9) for promoting cracking at the upper corner of link structures for efficient link removal. FIG. 8 shows the faster cracking at the upper corner 99 of a link structure, which provides stress relief and delays lower corner cracking. The pulses have a sufficient duration, for example 10 ns, for cleanly removing links. In one embodiment the pulse width is adjustable, and may be selected as a function of the specified link thickness. The rapid fall time terminates the laser pulse before damage occurs to the underlying silicon substrate. These pulse shapes may be used when practicing the present invention, and are especially useful for metal link processing. In certain embodiments a fast rise-time semiconductor laser is used as a seed laser in conjunction with an optical amplifier, for instance a fiber optic amplifier. A wavelength of 1.064 microns is an available laser wavelength within the gain spectrum of a Yb doped fiber amplifier. The shorter wavelength also provides for a smaller spot distribution than other near infrared wavelengths (eg: 1.3 microns) used for link blowing, as taught in U.S. Pat. No. 5,998,759, assigned to the assignee of the present invention, the entire disclosure of which is hereby incorporated herein by reference.

It is possible to identify experimentally the energy window that can be achieved by aligning the linear or elliptical polarization of the laser beam with links. The laser system can be used to cut every other link in a bank of links (which may include thousands of links), with the polarization of the laser beam being aligned with each link, and with each link being cut at a slightly different energy. The links are then inspected to determine whether the links are cut cleanly, or whether the cut is ragged or material is blown out of the cutting area due to laser energy not being cleanly absorbed by the link. If the laser energy is too low the link will not be disconnected cleanly and if it is much too low the link will not be disconnected at all. If the laser energy is too high, damage may occur to the substrate surrounding the link and to surrounding features such as other links. The links that are cleanly cut define the energy window.

By performing the same procedure with the linear or elliptical polarization of the laser beam being aligned perpendicular with each link, or with circular polarization of the laser beam, or any other possible polarization, it is possible to identify the energy window corresponding to these polarizations as well. It has been discovered, using these techniques, that the energy window can be increased by aligning a linearly polarized laser beam with the links to be cut.

In accordance with one embodiment of the invention, a high Numerical Aperture (for a smaller spot) beam was used in conjunction with a fast-rising laser pulse. The energy window was maximized with selection of linear polarization orthogonal to the link. The target was a copper link that was part multilayer memory device.

Experimental results for copper link removal on a multilayer memory device have shown that the orientation of the polarization of a laser beam has a critical effect on hole cut size, as well as material removal, due to the effect of the orientation of the polarization on the energy coupling into the link. Thus, proper selection of laser beam polarization can increase the energy window significantly. By varying the polarization, it is possible to control of hole size and the energy level for complete link removal by changing the energy coupling into the link, thereby increasing the energy window significantly. The energy window is more sensitive to polarization selection as the spot size decreases.

The process of selecting the orientation of the polarized laser beam can include obtaining from a computer stored alignment data designating a reference direction that defines the orientation of the length of the structure to be processed by the laser beam. Alternatively, the reference direction may be defined with respect to the system coordinates of the laser processing system. A reference frame can relate coordinates of the structure to be processed by the laser beam with coordinates of the laser processing system.

Copper is highly reflective in the 1 $\mu$m wavelength range and, therefore, higher laser energy is required in order to blow the link at near-infrared wavelengths compared to short visible and UV wavelengths. In addition, copper has a low coefficient of thermal expansion (CTE) and requires a higher temperature to initiate cracking at upper corner compared with aluminum.

On the other hand, as shown in FIGS. 9A and 9B, certain memory structures have numerous more silicon nitride layers 110 in multi-level copper metallization technologies. That's because copper lines are usually patterned with a dual damascene strategy that employs a silicon nitride as an etch stop/hard mask. Also, the silicon nitride acts as a diffusion barrier layer and, therefore, each copper metallization 112 is sandwiched between two silicon nitride layers These silicon nitride layers reduce damages to substrate even for high power laser processing. This is due in part to the high reflectance of the laser beam by the multiple silicon nitride layers at certain wavelengths. On the other hand, the fuse pitch for copper links is relatively large and neighbor structure damage is not likely to be the limiting factor. Therefore, the high end of the energy window is considered to be limited by the lower corner cracking and the low end to be defined by clean material removal.

As previously mentioned, copper processing requires relatively high laser energy at near infrared wavelengths in order to perform a reliable cut (eg: copper is about 98% reflective at 1.064 microns, compared to about 30% at 400 nm). Big hole sizes after processing are typical for the cut sites of copper fuses due to the required high-power laser.

When the tensile stress reaches the critical stress of the dielectric, cracks initiate and propagate within the dielectric perpendicularly to the local maximum principle tensile stress. However, the dielectric layer has a weakness point in the vicinity of the corners due to the chemical mechanical polishing (CMP) process as well as the weak interface between the SiN layer 110 and the $SiO_2$ layer 111, and so the critical stress for cracking is considered to be lower than other fuses. For this reason, the cracks tends to take a different path, which follows the weak interface of the SiN and $SiO_2$ layers, and laterally propagating upper cracks 99, as shown in FIG. 8. This contributes to the big hole cut size. In addition, thermal diffusion from the heated link into dielectric layers on the top of the link by relatively high laser energy irradiation could be attributed to severe delamination of silicon nitride and silicon dioxide layers, and this also may contribute to the large cut size.

Therefore, the hole size is also another limiting factor for the high end of the energy window together with a lower corner cracking. For this reason, the copper fuse requires a bigger fuse pitch than that of an aluminum fuse. A big hole at the cut site, after a laser irradiation, was found where the width of copper fuse was 0.7 μm and the spot size used was 3 μm.

Figure 13:
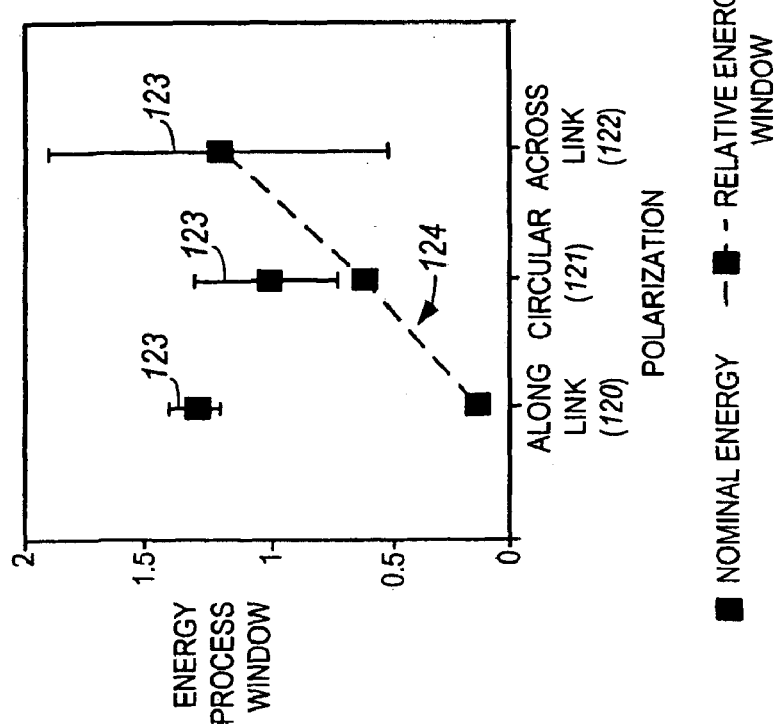
FIG. 13 is a diagram of the energy windows obtained using various polarization modes to process a copper link, as well as the relative energy windows and the nominal energy required for link removal.

In order to control and minimize the hole size after laser irradiation, the effect of polarization was investigated. It was found that a great improvement in the energy window could be attained by choosing the correct polarization, as can be seen in FIG. 13. Laser pulses with three different polarizations, along the link (120), circular (121), and across the link (122), were applied on the same structures and the energy windows were examined. Three vertical lines 123 indicate the absolute laser energy ranges where the links were processed successfully. The energy range was determined by optical microscopic observations. Material remaining was the lower limit and neighbor damage caused by big hole size was the upper limit in determining the energy window.

The dotted line 124 indicates the change of relative energy window depending on polarization mode. The relative energy window is redefined by the ratio of difference between high and low end of energy window $(E_h-E_l)$ to the average energy $(E_a=(E_h+E_l)/2)$.

$$\text{Relative Energy Window} = \frac{E_h - E_l}{E_a}$$

This normalized, non-dimensional term considers the performance of the laser systems clearly and eliminates the dependence of the absolute energy window on the characteristics of different laser systems as discussed in J. Lee et. Al, "Analysis of Energy Process Window of Laser Metal Pad Cut Link Structure," *IEEE Semiconductor Manufacturing* (submitted).

FIG. 13 demonstrates that the energy window is strongly dependent on polarization. Specifically it indicates that cross-link polarization (130) is optimum for this particular structure. The relative energy window changes significantly depending on the polarization mode. It is believed that changing polarization results in a unique heat distribution in the link.

Figure 14:
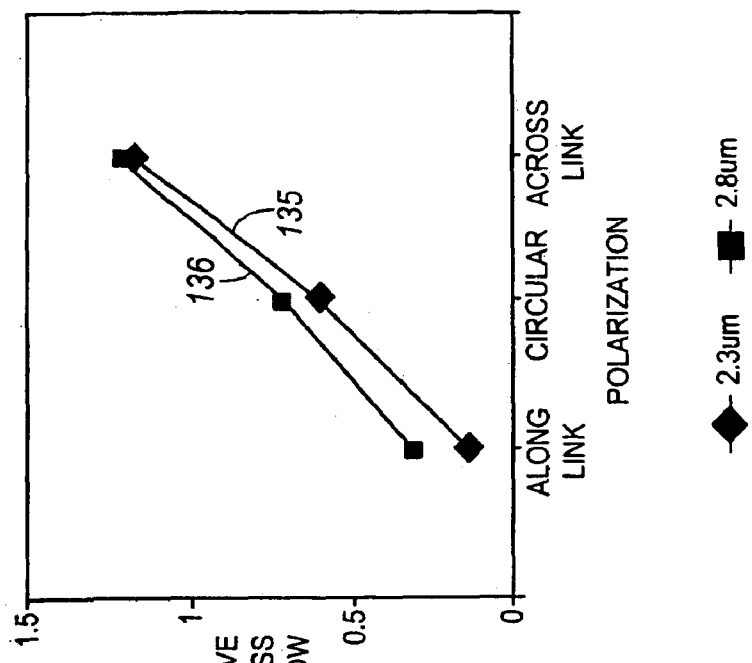
FIG. 14 is a diagram of the relative energy windows obtained using various polarization modes and using two different spot sizes to process a copper link, the diagram illustrating the relationship between the focused spot size, polarization, and energy window.

FIG. 14 displays two trends of the relative energy windows with a variation of spot size, and illustrates the impact of changing spot size with polarization. Basically, the two curves show the same trend and the energy window of copper links processed with a spot of 2.3 microns in $1/e^2$ diameter 135 is smaller than that of 2.8 μm spot 136. Also, with a polarization along the link and circular polarization, the energy window becomes narrower, but it is almost the same with a polarization across the link. However, the curves indicate that the polarization effect trend with a spot size of 2.3 μm is steeper than the case of 2.8 μm spot size. This indicates that polarization is more critical on laser energy window of copper processing when a smaller spot size is required.

The use of a fast rise/fall-time laser pulse has been simulated in order to study the copper cut process. The results shows that the lower corner cracking has been delayed by about 1 ns due to the faster upper cracking and subsequent stress release effect. It has also been shown that appropriate selection of the polarization of the laser beam has a critical effect on hole cut size, as well as material removal, by changing the energy coupling into the link, thereby increasing the energy window significantly. For the smaller spots, the effect of polarization selection is more pronounced.

The embodiments and application for the invention have been shown for an exemplary link structure that is rectangular in shape with a dimension below 1 micron and an aspect ratio exceeding 2:1. However, it is to be understood that the invention may be used for processing other structures, for instance the metal interconnect structures described in U.S. Pat. No. 6,057,221 to Bernstein. Likewise, the invention may be applied to other target structures of arbitrary shape or having bilateral or circular symmetry. Various modifications of a system of the present invention, including modifications of focused spot profiles, pulse shape, the polarization control mechanism, laser wavelength, and selection of alternative beam positioning components and alignment methods may be made without departing from the spirit of the invention. Likewise, the invention may be applied to processing and micromachining applications other than memory repair.

There have been described novel and improved apparatus and techniques for laser processing of semiconductor devices. The invention is to be construed as embracing each and every novel feature and novel combination of features present in or possessed by the apparatus and techniques herein disclosed. It is also evident that those skilled in the art may now make numerous uses and modifications of and departures from the specific embodiments described herein without departing from the inventive concept.

What is claimed is:

1. A method of laser processing of a structure comprising:
   providing a multilevel, multi-material device comprising a target structure positioned over a substrate;
   providing a laser processing system that produces a non-circularly polarized laser beam, having a beam providing element and a focusing element;
   performing an orientation determining step to determine an orientation of the target structure and the polarized laser beam relative to each other such that processing of the target structure by the polarized laser beam occurs within a processing energy window that is larger than processing energy windows corresponding to other orientations of the structure and the polarized laser beam relative to each other;
   processing the structure by the beam providing element providing the non-circularly polarized laser beam and the focusing element focusing the non-circularly polarized laser beam onto the target structure, the structure and the polarized laser beam being at the orientation relative to each other determined by the orientation determining step, the non-circularly polarized laser beam being oriented substantially parallel to the target structure or substantially perpendicular to the target structure such that the range of pulse energies that process the target structure cleanly and reliably is at or near the maximum.

2. The method of claim 1 wherein the multi-layer, multi-material device is a semiconductor memory device and the target structure is a metal link.

3. The method of claim 1 wherein the target structure is separated from the substrate by at least one dielectric layer.

4. The method of claim 1 wherein the target structure has a rectangular cross section.

5. The method of claim 1 wherein the target structure is less than one micron in a dimension.

6. The method of claim 1 wherein the target structure comprises copper.

7. The method of claim 6 wherein the determined orientation of the structure and the polarized laser beam relative to each other is perpendicular to each other.

8. The method of claim 1 wherein the multilevel device further comprises functional circuitry disposed at a dielectric level between the target structure and the substrate.

9. The method of claim 1 wherein the multilevel device comprises at least one pair of dielectric layers disposed between the target structure and substrate, the layers having different indices of refraction.

10. The method of claim 1 wherein the polarized laser beam has a reflected intensity that varies with polarization of the focused laser beam.

11. The method of claim 1 wherein the processing energy window that is larger than other processing windows is determined, in the orientation determining step, by a combination of incident spot energy coupling into the target structure and incident energy reflected from at least one other layer of the multilevel, multimaterial device.

12. The method of claim 1 wherein the step of processing the structure by focusing the polarized laser beam onto the target structure comprises focusing the polarized laser beam into a spot distribution having a shape that is substantially a circular Gaussian shape.

13. The method of claim 1 wherein step of processing the structure by focusing the polarized laser beam onto the target structure comprises focusing the polarized laser beam into a spot distribution having a shape that is substantially an elliptical Gaussian shape.

14. The method of claim 1 wherein the step of processing the structure by focusing the polarized laser beam onto the target structure comprises focusing the polarized laser beam into a spot distribution having a shape that is substantially a top hat shape.

15. The method of claim 1 wherein the focused spot has a width of less than 3 um in one dimension.

16. The method of claim 1 wherein the focused spot has a width of less than 2.5 um in one dimension.

17. The method of claim 1 wherein the focused spot has an M-squared factor of less than about 2.

18. The method of claim 1 wherein the focused spot is substantially diffraction limited with an M-squared factor of less than about 1.1.

19. The method of claim 1 wherein the laser beam polarization is substantially linear.

20. The method of claim 1 wherein the laser beam polarization is substantially elliptical.

21. The method of claim 1 wherein the determined orientation is parallel with the polarized laser beam.

22. The method of claim 1 wherein the determined orientation is perpendicular to the polarized laser beam.

23. The method of claim 1 further comprising the steps of providing, in the laser processing system, an analyzer tool arranged to receive the polarized laser beam, the analyzer tool being configured to analyze the polarization of the laser beam.

24. The method of claim 23 further comprising the step of removing the analyzer tool from the laser processing system.

25. The method of claim 23 wherein the step of analyzing the polarization of the laser beam is performed at a point of manufacture of the laser processing system.

26. The method of claim 23 wherein the step of analyzing the polarization of the laser beam is performed at a point of installation of the polarization modifying device into the laser processing system.

27. The method of claim 1 wherein the laser processing system includes a beam positioner.

28. The method of claim 27 wherein the beam positioner is a pair of galvanometers.

29. The method of claim 1 wherein the target structure comprises one level and one material of the multilevel, multi-material device and the substrate comprises another level and another material of the multilevel, multi-material device.

30. A method of laser processing of a structure comprising:
providing a structure to be processed;
providing a laser processing system that produces a polarized laser beam, having a beam providing element and a focusing element;
performing an alignment determining step to determine alignment of the structure to be processed by the laser beam;
performing an orientation determining step to determine an orientation of the structure and the polarized laser beam relative to each other such that processing of the target structure by the polarized laser beam occurs within a processing energy window that is larger than processing energy windows corresponding to other orientations of the structure and the polarized laser beam relative to each other;
processing the structure by the beam providing element providing the non-circularly polarized laser beam and the focusing element focusing the non-cicularly polarized laser beam onto the target structure, the structure being at the alignment determined by the alignment determining step, and the structure and the polarized laser beam being at the orientation relative to each other determined by the orientation determining step, the non-circularly polarized laser beam being oriented substantially parallel to the structure or substantially perpendicular to the structure such that the range of pulse energies that process the structure cleanly and reliably is at or neat the maximum.

31. The method of claim 30 wherein the step of determining an orientation further comprises designating a reference direction defining the orientation of the structure relative to the polarized laser beam.

32. The method of claim 31 wherein the reference direction is obtained from stored alignment data.

33. The method of claim 31 wherein the reference direction is along the length of the structure.

34. The method of claim 31 wherein the reference direction is defined relative to the laser processing system coordinates.

35. The method of claim 30 wherein the step of determining an orientation further comprises identifying a reference frame relating coordinates of the structure with laser processing system coordinates.

36. A polarization-based laser processing system for processing multi-material target structures comprising:
- a pulsed laser source having a pulse providing element of laser pulses at an operating wavelength;
- a polarization modifying device;
- an optical system having a focusing element of a laser beam from the pulsed laser source onto the target structure;
- wherein the optical system has a laser spot size selecting element, the pulsed laser source has a pulse width selecting element, and the polarization modifying device has a non-circular polarization selecting element, so as to obtain an energy window, of laser pulses provided by the pulse providing element and focused by the focusing element, that is larger than an energy window obtained with other selection of spot size, pulse width, and polarization, the non-circular polarization selecting element causing the non-circularly polarized laser beam to be oriented substantially parallel to the target structure or substantially perpendicular to the target structures such that the range of pulse energies that process the target structures cleanly and reliably is at or neat the maximum.

37. The polarization-based laser system of claim 36 wherein the operating wavelength is less than 1.2 microns.

38. The polarization-based laser system of claim 36 wherein the operating wavelength is about 1.064 microns.

39. The polarization-based laser system of claim 36 wherein the pulse width is a duration of about 10 nanoseconds.

40. The polarization-based laser system of claim 36 wherein the pulsed laser source has a pulse shape obtaining element of laser pulses have a fast-rise pulse shape with a nearly vertical rise.

41. The polarization-based laser system of claim 36 wherein the pulsed laser source has a pulse shape obtaining element of laser pulses have a nearly rectangular pulse shape.

42. The polarization-based laser system of claim 36 wherein the pulsed laser source comprises a q-switched laser that produces q-switched pulses.

43. The polarization-based laser system of claim 36 wherein the pulsed laser system has an amplified mode locked pulse train producing element.

44. The polarization-based laser system of claim 36 wherein the polarization modifying device comprises a liquid crystal diode.

45. The polarization-based laser system of claim 36 wherein the polarization modifying device is a motorized device.

46. The polarization-based laser system of claim 36 wherein the optical system has a high numerical aperture designed to produce a spot distribution having an M-squared factor of less than 1.1, wherein the M-squared factor of less than 1.1 is defined as indicating a less than 10% deviation from ideal performance.

47. A method of laser processing of a multi-material target structure comprising:
- providing a multilevel, multi-material device comprising a target structure positioned over a substrate;
- providing a polarization-based laser processing system comprising a pulsed laser source having a pulse providing element of laser pulses at an operating wavelength, a polarization modifying device having a non-circular polarization selecting element, and an optical system having a laser spot size selecting element and a focusing element of a laser beam from the pulsed laser source onto the target structure;
- selecting a laser spot size using the optical system and selecting a non-circular polarization using the polarization modifying device, so as to obtain an energy window of pulses provided by the pulse providing element that is larger than an energy window obtained with other selections of spot size and polarization, the non-circularly polarized laser beam being oriented substantially parallel to the target structure or substantially perpendicular to the target structure such that the range of pulse energies that process the structure cleanly and reliably is at or near the maximum.

48. A method of laser processing of a multi-material target structure comprising:
- providing a multilevel, multi-material device comprising a target structure positioned over a substrate;
- providing a polarization-based laser processing system comprising a pulsed laser source having a pulse width selecting element and having a pulse providing element of laser pulses at an operating wavelength, a polarization modifying device having a non-circular polarization selecting element, and an optical system configured to focus a laser beam from the pulsed laser source onto the target structure;
- selecting a pulse width using the pulsed laser source and selecting a non-circular polarization using the polarization modifying device, so as to obtain an energy window of pulses provided by the pulse providing element that is larger than an energy window obtained with other selections of pulse width and polarization, the non-circularly polarized laser beam being oriented substantially parallel to the structure or substantially perpendicular to the structure such that the range of pulse energies that process the structure cleanly and reliably is at or near the maximum.

49. A laser polarization control apparatus comprising:
- a polarization modifying device for receiving a laser beam and modifying the polarization of the laser beam, the laser beam having a non-circular modified polarization; and
- a controller, connected to the polarization modifying device, for adjusting an input to the polarization modifying device in order to control modification of the polarization of the laser beam based on alignment of a structure to be processed by the laser beam;
- the polarization modifying device being incorporatable into a laser processing system that produces the laser beam received by the polarization modifying device and that focuses the laser beam modified by the polarization modifying device onto a workpiece that includes the structure to be processed by the laser beam;
- wherein the input to the polarization modifying device is adjustable by the controller so as to cause a processing energy window, whose size changes depending upon orientations of the structure and the polarized laser beam relative to each other, to be at or near the maximum such that processing of the structure by the non-circularly polarized laser beam occurs within approximately the maximum processing energy window, the controller causing the non-circularly polarized laser beam to be oriented substantially parallel to the structure or substantially perpendicular to the structure such that the range of pulse energies that process the structure cleanly and reliably is at or near the maximum.

50. A method of controlling laser polarization comprising:

obtaining a laser processing system having a beam producing element that produces a laser beam and a focusing element that focuses the laser beam onto a workpiece that includes a structure to be processed by the laser beam;

performing an alignment determining step to determine alignment of each of a plurality of structures to be processed by the laser beam;

performing an orientation determining step, with respect to each one of the structures, to determine an orientation of the structure and the polarized laser beam relative to each other so as to cause a processing energy window, whose size changes depending upon orientations of the structure and the polarized laser beam relative to each other, to be at or near the maximum such that processing of the structure by the polarized laser beam occurs within approximately the maximum processing energy window;

modifying polarization of the laser beam based on the alignment of each of the structures to be processed by the laser beam; and processing the structures using the laser processing system by the beam producing element producing the laser beam and the focusing element focusing the laser beam having a modified, non-circular polarization onto the structures, the structure being at the alignment determined by the alignment determining step, and the structure and the polarized laser beam being at the orientation relative to each other determined by the orientation determining step, the laser beam having the modified, non-circular polarization being oriented substantially parallel to each one of the structures or substantially perpendicular to each one of the structures such that the range of pulse energies that process the structures cleanly and reliably is at or near the maximum.

51. A method of laser processing of a structure comprising:

obtaining a structure to be processed;

obtaining a laser processing system having a non-circularly polarized beam producing element that produces a non-circularly polarized laser beam and having a focusing element;

performing an orientation determining step to determine an orientation of the structure and the non-circularly polarized laser beam relative to each other so as to cause a processing energy window, whose size changes depending upon orientations of the structure and the non-circularly polarized laser beam relative to each other, to be at or near the maximum such that processing of the structure by the non-circularly polarized laser beam occurs within approximately the maximum processing energy window;

processing the structure by the non-circularly polarized beam producing element producing the non-circularly polarized laser beam and the focusing element focusing the non-circularly polarized laser beam onto the structure, the structure and the polarized laser beam being at the orientation relative to each other determined by the orientation determining step, the non-circularly polarized laser beam being oriented substantially parallel to the structure or substantially perpendicular to the structure such that the range of pulse energies that process the structure cleanly and reliably is at or near the maximum.

52. A method of laser processing of a structure comprising:

obtaining a structure to be processed;

obtaining a laser processing system having a non-circularly polarized beam producing element that produces a non-circularly polarized laser beam and having a focussing element;

performing an orientation determining step to determine an orientation of the structure and the non-circularly polarized laser beam relative to each other so as to cause a processing energy window, whose size changes depending upon orientations of the structure and the non-circularly polarized laser beam relative to each other, to be larger than the minimum such that processing of the structure by the non-circularly polarized laser beam occurs within the larger processing energy window; and processing the structure by the non-circularly polarized beam producing element producing the non-circularly polarized laser beam and the focusing element focusing the non-circularly polarized laser beam onto the structure, the structure and the non-circularly polarized laser beam being at the orientation relative to each other determined by the orientation determining step, wherein processing the structure comprises cleanly removing the structure while avoiding unacceptable damage to adjacent structures, the processing energy window being the range from an upper energy limit, above which unacceptable damage occurs to an immediately adjacent structure, to a lower energy limit, below which the structure is not cleanly removed, the non-circularly polarized laser beam being oriented with respect to the structure such that the range of pulse energies that process the structure cleanly and reliably while avoiding unacceptable damage to adjacent structures is above the minimum.

53. The method of claim 52 wherein the processing energy window is at or near the maximum such that processing of the structure by the non-circularly polarized laser beam occurs within approximately the maximum processing energy window.

54. The method of claim 53 wherein the non-circularly polarized laser beam is oriented substantially parallel to the structure or substantially perpendicular to the structure such that the range of pulse energies that process the structure cleanly and reliably is at or near the maximum.

55. A polarization-based laser processing system for processing multi-material target structures comprising:

a pulsed laser source having a pulse providing element of laser pulses at an operating wavelength;

a polarization modifying device;

an optical system having a focusing element of a laser beam from the pulsed laser source onto the target structure;

wherein the optical system has a laser spot size selecting element, the pulsed laser source has a pulse width selecting element, and the polarization modifying device has a non-circular polarization selecting element, so as to obtain a processing energy window, of laser pulses provided by the pulse providing element and focused by the focusing element, that is larger than a processing energy window obtained with at least some other selections of spot size, pulse width, and polarization, the processing energy window being the range from an upper energy limit, above which unacceptable damage occurs to an immediately adjacent structure, to a lower energy limit, below which the structure is not cleanly removed, the non-circular polarization selecting element causing the non-circularly polarized laser beam to be oriented substantially parallel to the target structures or substantially perpendicular to the target structures such that the range of pulse energies that process the target structures cleanly and reliably is at or near the maximum.

* * * * *

UNITED STATES PATENT AND TRADEMARK OFFICE
CERTIFICATE OF CORRECTION

PATENT NO. : 6,987,786 B2
DATED : January 17, 2006
INVENTOR(S) : Cordingley et al.

It is certified that error appears in the above-identified patent and that said Letters Patent is hereby corrected as shown below:

Column 14,
Line 56, delete "neat" and replace with -- near --.

Column 15,
Line 20, delete "selection" and replace with -- selections --.
Line 24, delete "structure" and replace with -- structures --.
Line 27, delete "neat" and replace with -- near --.
Line 48, delete "train" and replace with -- gain --.

Column 18,
Line 12, delete "focussing" and replace with -- focusing --.

Signed and Sealed this

Twenty-first Day of March, 2006

JON W. DUDAS
*Director of the United States Patent and Trademark Office*